United States Patent [19]
LaRocca et al.

[11] Patent Number: 5,546,082
[45] Date of Patent: Aug. 13, 1996

[54] MEASUREMENT PROBE WITH IMPROVED ANALOG-TO-DIGITAL CONVERSION

[75] Inventors: Brian LaRocca, Little Falls, N.J.; Gregory T. O'Brien, Mission Viejo, Calif.

[73] Assignee: Rosemount Analytical Inc., Eden Prairie, Minn.

[21] Appl. No.: 231,274

[22] Filed: Apr. 22, 1994

[51] Int. Cl.$^6$ .................................................. H03M 1/50
[52] U.S. Cl. ............................................ 341/166; 341/128
[58] Field of Search ...................................... 341/127, 128, 341/129, 166, 167, 168

[56] References Cited

U.S. PATENT DOCUMENTS

| | | | |
|---|---|---|---|
| 4,063,236 | 12/1977 | Amemiya et al. | 341/167 |
| 4,243,975 | 1/1981 | Masuda et al. | 340/347 NT |
| 4,418,392 | 11/1983 | Hata | 364/571 |
| 4,598,381 | 7/1986 | Cucci | 364/558 |
| 4,608,553 | 8/1986 | Ormond | 340/347 |
| 4,672,306 | 6/1987 | Thong | 324/72.5 |
| 4,694,277 | 9/1987 | Takahashi | 340/347 |
| 4,739,305 | 4/1988 | Naito | 340/347 |
| 4,908,623 | 3/1990 | Ullestad | 341/167 |
| 4,910,516 | 3/1990 | Krenik | 341/118 |
| 4,959,651 | 9/1990 | Yamanda | 341/131 |
| 5,097,264 | 3/1992 | Brenner et al. | 341/167 |
| 5,245,343 | 9/1993 | Greenwood et al. | 341/143 |
| 5,262,779 | 11/1993 | Sauer | 341/161 |

OTHER PUBLICATIONS

Lancaster, CMOS Cookbook, ©Howard W. Sams & Co., PTO Library date Aug. –1980 pp. 372–733.
National Semiconductor, "MM54HC4316/MM74HC4316 Quad Analog Switch With Level Translator", pp. 2–60.
National Semiconductor, "MM54HC4051/MM74HC4051 8–Channel Analog Multiplexer MM54HC4052/MM74HC4052 Dual 4–Channel Analog Multiplexer MM54HC4053/MM74HC4053 Triple 2–Channel Analog Multiplexer", pp. 2–58.
National Semiconductor, "LM193/LM293/LM393, LM193A/LM293A/LM393A, LM2903 Low Power Low Offset Voltage Dual Comparators", pp. 5–61.
INTEL, "CHMOS Components Handbook", 1985, pp. 4–10 —4–24.
Electronics Engineers' Handbook, "Integrated–Circuit Design", pp. 8–70 and 8–71.
Instrumentation for Scientists Series, "Digital and Analog Data Conversions", 1973, pp. 310– 316.

Primary Examiner—Howard L. Williams
Attorney, Agent, or Firm—Westman, Champlin & Kelly, P.A.

[57] ABSTRACT

A measuring probe measures a parameter with a sensor. The sensor provides a sensor output signal related to a measured value. An amplifier section receives the sensor output signal and provides an amplifier output signal. An integrator has an input and an integrator output related to an integration of the input. Switching circuitry receives the amplifier output signal and a reference signal and has an output connected to the input of the integrator. Controller circuitry coupled to the switching circuitry connects the amplifier output to the integrator input during a sampling time, and the reference signal to the integrator input during a conversion time. The conversion time is related to the sensor output signal and is measured to obtain a digital representation of the sensor output.

11 Claims, 2 Drawing Sheets

MEASUREMENT PROBE WITH IMPROVED ANALOG-TO-DIGITAL CONVERSION

BACKGROUND OF THE INVENTION

The present invention relates to measurement probes. In particular, the present invention relates to measurement probes including analog-to-digital conversion circuitry for providing a digital output of a measured value.

Measurement probes used to measure a value and provide an output are known. These probes can be used to measure, for example, temperature of a liquid. A controller sends digital data to the probe to initiate measurement. Measurement data and test results are sent from the probe to the controller.

In some measurement probes, an analog-to-digital converter in the probe converts a measured value into a digital value which is communicated to the controller. U.S. Pat. No. 4,418,392, issued Nov. 29, 1983, to Hata, entitled "Measuring Device" is an example of a measuring device having a transducer and an analog-to-digital converter. It is known to have the probe transmit status information to the controller. It is also known to have probes capable of displaying digital information.

SUMMARY OF THE INVENTION

A measuring probe for measuring a parameter includes a sensor and provides a digital output of a measured value of the parameter. One aspect of the invention includes an amplifier section, an integrator, a switching circuit and controller circuitry. The amplifier section receives a sensor output signal and provides an amplified output signal. The integrator has an input and an output related to an integration of the input. The switching circuit receives the amplified output signal and a first reference input. The controller circuitry controls the switching circuit whereby the input to the integrator alternately couples to the amplifier section during a sampling time and the reference signal during a conversion time. The conversion time is related to the measured value.

DETAILED DESCRIPTION OF THE PREFERRED EMBODIMENTS

Figure 1:
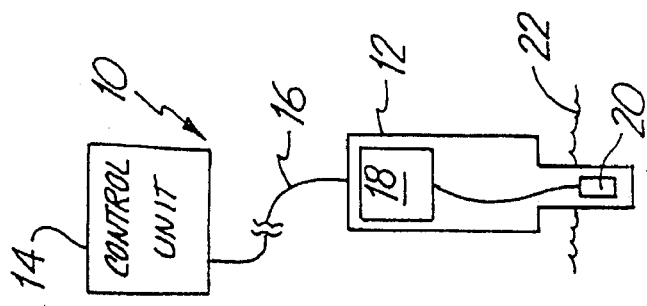
FIG. 1 shows a controller coupled to a measuring probe in accordance with the present invention.

FIG. 1 shows a measurement system 10 in accordance with the present invention. Measurement system 10 includes measuring probe 12 coupled to control unit 14 through power/communication link 16. Measuring probe 12 includes sensor electronics 18 and transducer 20 placed in a fluid 22 to be measured.

Figure 2:
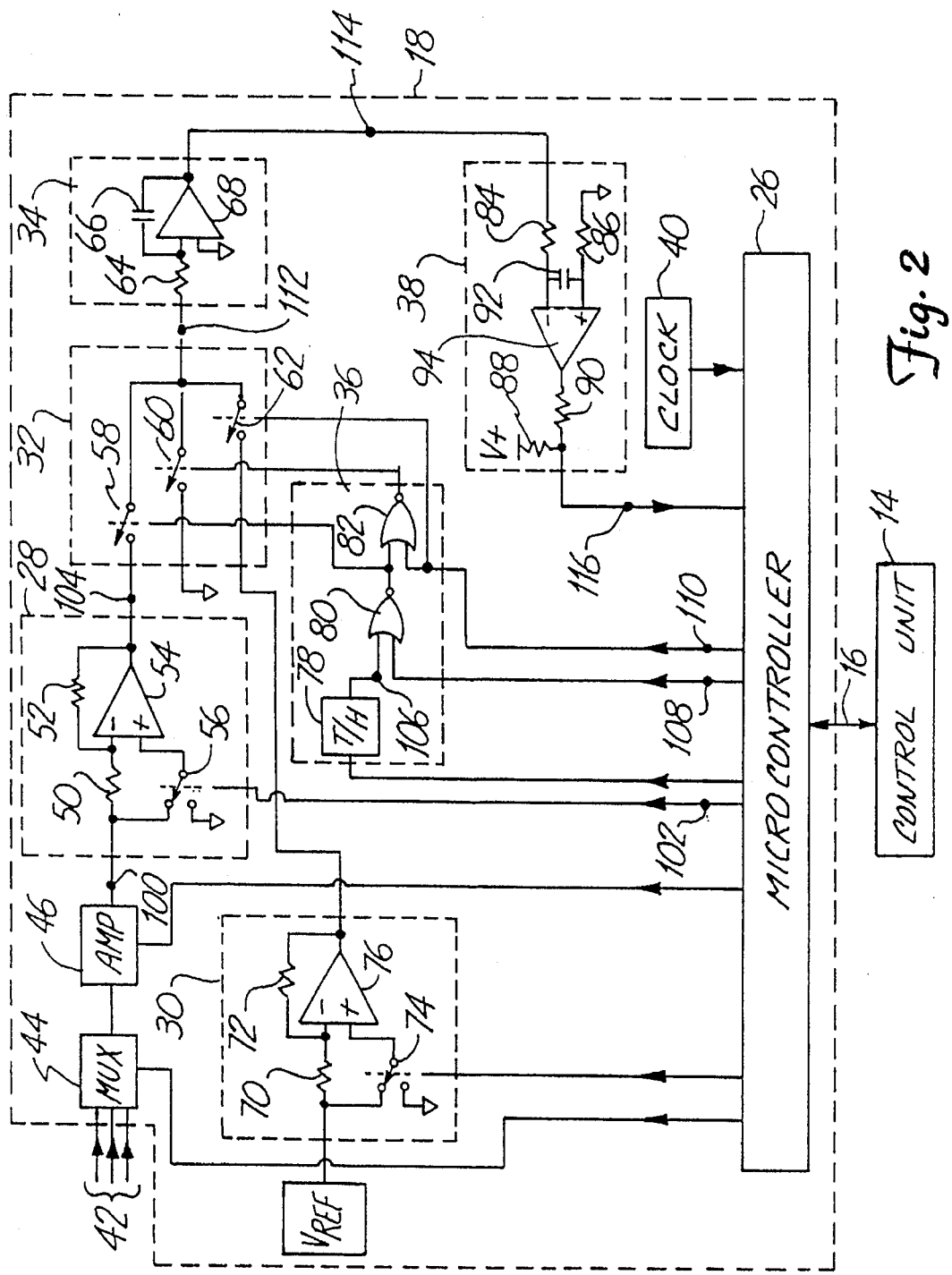
FIG. 2 is an electrical schematic and block diagram of circuitry of probe electronics in accordance with the invention.

FIG. 2 shows a more detailed view of sensor electronics 18. Sensor electronics 18 includes microcontroller 26, inverter followers 28 and 30, switching circuit 32, integrator 34, discrete logic unit 36, comparator 38 and clock 40. Sensor electronics 18 includes transducer connections 42 coupled to multiplexer 44. Multiplexer 44 has a control input coupled to microcontroller 26 and an output coupled to variable gain amplifier 46. Amplifier 46 has a control input which couples to microcontroller 26 and an output which couples to inverter follower 28. Amplifiers 28 and 46 form an amplifier section. Similarly, inverter follower 30 and discrete logic unit 36 have control inputs coupled to microcontroller 26.

The output of inverter 28 couples to switching circuit 32 which connects to integrator 34. Inverter 28 provides an input to switching circuit 32 identified as 104 in the figure. Discrete logic unit 36 has control outputs which couple to switching circuit 32. Integrator 34 has an output which couples to comparator 38 whose output in turn couples to controller 26. Clock 40 provides a clock input to controller 26. A reference voltage $V_{Ref}$ connects to the input of inverter follower 30. FIG. 2 also shows communication link 16 between control unit 14 and microcontroller 26.

Inverter follower 28 includes resistors 50 and 52, opamp 54 and switch 56. Switching circuit 32 includes switches 58, 60 and 62. Integrator 34 includes resistor 64, capacitor 66 and opamp 68. Inverter follower 30 includes resistors 70 and 72, switch 74 and opamp 76. Discrete logic unit 36 includes track and hold circuit 78 and NOR gates 80 and 82. Comparator 38 includes resistors 84, 86, 88 and 90, capacitor 92 and opamp 94.

Figure 3:
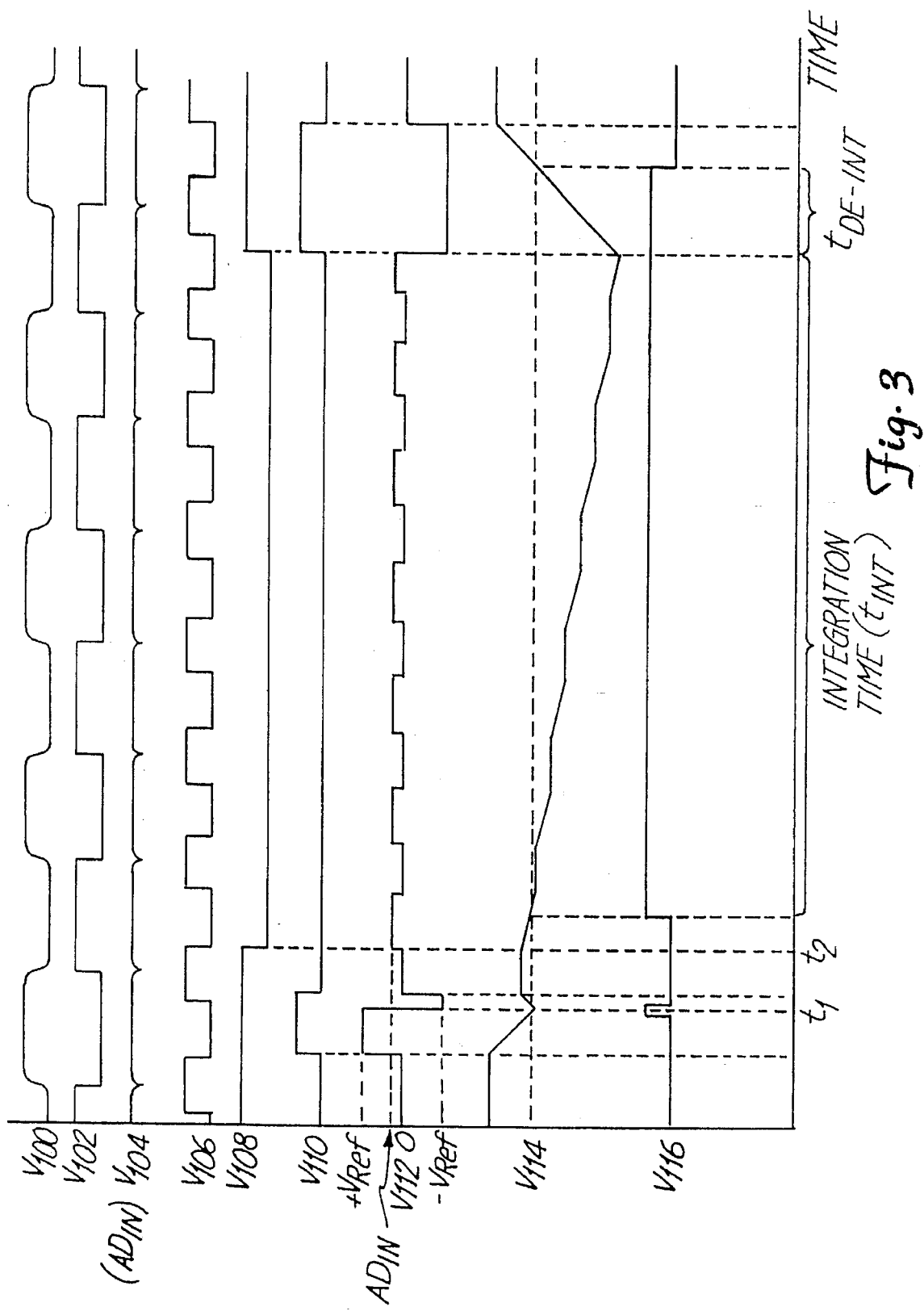
FIG. 3 is a timing diagram of electrical signals in the circuitry of FIG. 2.

FIG. 3 illustrates various signals which are present during operation of electronics 18, shown in FIG. 2. FIG. 3 is a graph of signal level versus time. FIG. 3 shows voltage levels $V_{100}$, $V_{102}$, $V_{104}$, $V_{106}$, $V_{108}$, $V_{110}$, $V_{112}$, $V_{114}$ and $V_{116}$ taken at the various test points 100 through 116, respectively, shown in FIG. 2.

In operation, measuring probe 12 communicates with and receives power over power/communication link 16 from control unit 14. Probe electronics 18 are coupled to transducer 20 and measures a property of liquid 22, such as temperature or conductivity or pH. Electronics 18 transmits this information to control unit 14 over link 16. Electronics 18 converts the analog output from transducer 20 into a digital format for transmission to control unit 14. Circuitry for conversion of an analog signal into a digital signal is shown in FIG. 2.

Microcontroller 26 receives a clock input from clock 40 and a signal ($V_{116}$ in FIG. 3) from comparator 38. These two inputs are used to generate a digital value for a signal received from transducer 20 through multiplexer 44. Under the control of microcontroller 26, multiplexer 44 selects which of the transducer connections 42 will be sensed. The transducer signal is amplified by amplifier 46 whose gain is controlled by microcontroller 26. Inverter follower 28 applies the amplified signal to the negative input of opamp 54 which also receives negative feedback from the output of amplifier 54. Switch 56, under the control of microcontroller 26, controls whether inverter follower 28 provides an inverted or a non-inverted output. In similar fashion, switch 74, under the control of microcontroller 26, controls whether inverter follower 30 provides $+V_{REF}$ or $-V_{REF}$ to switching circuit 32. Under the control of discrete logic unit 36, switching circuit 32 couples integrator 34 to either the output from inverter follower 28, electrical ground, or a reference level provided by inverter follower 30. Integrator 34 integrates the signal on its input 112 to generate an output at point 114 ($V_{114}$ in FIG. 3). Comparator 38 generates a logic level input ($V_{116}$ in FIG. 3) for microcontroller 26 based upon a comparison of integrator 34 output ($V_{114}$ in FIG. 3) and ground.

Referring to the timing diagram of FIG. 3 and the schematic of FIG. 2, operation will be explained in more detail.

The signal shown as $V_{100}$ presents the amplified input from a transducer 20. For purposes of this example, signal $V_{100}$ is shown as a square wave. Signal $V_{102}$ is a square wave which controls switch 56 and is generated by microcontroller 26. Signal $V_{102}$ is timed off the transitions in signal $V_{100}$ and causes inverter follower 28 to switch between an inverting and a non-inverting output. The output of circuit 28 is shown as $V_{104}$ and is referred to as $AD_{IN}$. Signal $V_{104}$ is largely DC, although there is a small noise spike during the transition of signal $V_{102}$ caused by the slew in signal $V_{100}$.

Signal $V_{106}$ is the output of track and hold circuit 78. Signal $V_{106}$ is a square wave at twice the frequency of $V_{102}$ having its positive pulse centered on transitions in signal $V_{102}$. Signal $V_{106}$ is provided to NOR gate 80. Gate 80 also receives signal $V_{108}$ from microcontroller 26. Microprocessor 26 applies signal $V_{110}$ to NOR gate 82. Outputs from discrete logic circuit 36 are coupled to switches 58, 60 and 62 causing the switches to selectively provide integrator 34 with a voltage reference (switch 62), ground (switch 60), or the rectified input signal $AD_{IN}$ (switch 58).

Signal $V_{112}$ shown in FIG. 3 represents the output of switching circuit 32. As shown by signal $V_{112}$, switching circuit 32 selectively provides ground, the inverted and non-inverted reference voltage $V_{REF}$, and the signal from the transducer ($AD_{IN}$). Signal $V_{114}$ shows the output of integrator 34 which changes based upon signal $V_{112}$ provided by switching circuit 32. Switching circuit 32, under the control of microcontroller 26, applies the reference voltage $V_{REF}$ to integrator 34 until signal $V_{114}$ is brought just below ground at a time $t_1$. Microcontroller 26 then toggles switch 74 to apply $-V_{REF}$ to integrator 34 until signal $V_{114}$ is brought slightly above ground potential, at which time microcontroller 26 changes signal $V_{110}$ to apply ground potential to integrator 34. At time $t_2$, microcontroller 26 changes signal $V_{108}$ so that switch circuit 32 applies the $AD_{IN}$ signal ($V_{104}$) to integrator 34. This causes the output of integrator 34 ($V_{114}$) to begin ramping down. As shown by signal $V_{112}$, the $AD_{IN}$ and ground signals are alternately applied to the input of integrator 34 as controlled by signal $V_{106}$ in discrete logic unit 36 under the control of microcontroller 26.

The $AD_{IN}$ and ground potential signals are alternately applied to integrator 36 over an integration time period ($t_{INT}$) which is a function of the characteristics and output signal strength of transducer 20 received through lines 42. In one embodiment, the integration time ($t_{INT}$) is 20 milliseconds. The output of integrator 34 ($V_{114}$) is provided to comparator 38 which compares $V_{114}$ with ground potential and provides a logical output $V_{116}$. $V_{116}$ is high when $V_{114}$ is negative, which occurs briefly at time $t_1$ and then again during the integration time $t_{INT}$ and the deintegration time $t_{DE-INT}$. The deintegration time $t_{DE-INT}$ is the time for the output of integrator 34 $V_{114}$ to return to ground potential.

The integration $t_{INT}$ is a function of the transducer whose output is being measured. During the deintegration time, switching circuit 32 applies the inverted $V_{REF}$ signal to the input of integrator 34. This leads to the following relationship:

$$\frac{AD_{IN} \times t_{INT}}{2} = |V_{REF}| \times t_{DE-INT} \qquad \text{Equation 1}$$

Note that the time $t_{INT}/2$ is used due to the blanking needed to eliminate the spikes in the $AD_{IN}$ input signal $V_{104}$. The blanking has a 50% duty cycle and the integration time $t_{INT}$ is effectively cut in half. Rearranging equation 1 gives the following formula $$AD_{IN} = \frac{|V_{REF}| \times t_{DE-INT}}{t_{INT}} \times 2 \qquad \text{Equation 2}$$

In a preferred embodiment, integration time is selected such that it is a harmonic of 50 or 60 Hz for improved noise rejection. In one embodiment, the integration time is a harmonic of both 50 and 60 Hz.

The circuitry of FIG. 2 is capable of converting both AC and DC analog inputs into a digital value. For the circuitry to measure an AC signal, inverter follower 28, under the control of microcontroller 26, selectively inverts the AC signal during the negative portion of its cycle to provide a substantially DC signal. The "glitch" that occurs during the transition is blanked with track and hold circuit 78 and discrete logic unit 36. To convert a DC signal to a digital value, microcontroller 26 controls inverter follower 28 to continually provide either an inverted or non-inverted output.

Using the formula of equation 2, microcontroller 26 calculates the value of $AD_{IN}$ based upon the known values of $V_{REF}$ and $t_{INT}$, and the measured value of $t_{DE-INT}$. In a preferred embodiment, microcontroller 26 is an 80C51.

Although the present invention has been described with reference to preferred embodiments, workers skilled in the art will recognize that changes may be made in form and detail without departing from the spirit and scope of the invention.

What is claimed is:

1. A measuring probe for measuring a parameter, comprising:

a sensor providing a sensor output related to a measured value of the parameter;

an amplifier section receiving the sensor output and providing an amplifier output;

an integrator having an input and an integrator output related to an integration of the input;

switching circuitry receiving the amplifier output, a first reference input, and a second reference input, and having a switch output coupled to the input of the integrator, the switching circuitry adapted to selectively couple the switch output to the amplifier output, the first reference input and the second reference input;

controller circuitry coupled to the switching circuitry and operable to alternately couple the integrator input to the amplifier output and the first reference during a sampling time and to the second reference input during a conversion time, the conversion time related to the measured value;

wherein the controller circuitry provides a controller output as a function of the conversion time; and wherein the coupling of the integrator to the amplifier output during the sampling time is an intermittent coupling.

2. The measuring probe of claim 1 wherein the amplifier output has a noise spike and the switching circuitry couples the first reference to the integrator input during the noise spike.

3. The measuring probe of claim 1 including means for converting the conversion time to a digital value.

4. The measuring probe of claim 1 wherein the integrator output slews in a first direction during the sampling time and in a second direction during the conversion time.

5. The measuring probe of claim 1 including a communication link for communicating information related to the measured value to a controller.

6. The measuring probe of claim 1 wherein the sensor comprises a pH sensor and the measured value is pH.

7. The measuring probe of claim 1 wherein the sensor comprises a temperature sensor and the measured value is temperature.

8. The measuring probe of claim 1 wherein the sensor output comprises an AC signal, the amplifier section is coupled to the controller and is selectively inverting and non-inverting whereby the amplifier output signal includes DC component.

9. The measuring probe of claim 1 including a communication link for receiving commands from a controller.

10. A measurement device for interfacing with a sensor probe having a probe output, comprising:

an input adapted for coupling to the probe output;

amplifier circuitry coupled to the input having a amplifier output;

an integrator stage having an integrator input and an integrator output, wherein the integrator output is related to integration of the input;

switching circuitry receiving the amplifier output and a first reference input, the switching circuitry having a switch output and adapted to couple the switch output to the amplifier output and the first reference input;

controller circuitry controlling the switching circuitry so as to couple the integrator input to the amplifier output during a sampling time and to the first reference input during a conversion time, the conversion time being related to the probe output; and wherein the coupling of the integrator to the amplifier output during the sampling time is an intermittent coupling.

11. The measurement device of claim 10 wherein the switching circuitry receives a second reference input and the controller couples the integrator input to the second reference input during the sampling time when the amplifier output contains a noise spike.

* * * * *

UNITED STATES PATENT AND TRADEMARK OFFICE
CERTIFICATE OF CORRECTION

PATENT NO. : 5,546,082
DATED : August 13, 1996
INVENTOR(S) : Brian LaRocca et al.

It is certified that error appears in the above-indentified patent and that said Letters Patent is hereby corrected as shown below:

Abstract:

After the last sentence, insert --The output of the amplifier is intermittently coupled to the integrator input.--

Col. 5, line 7, after "includes" insert --a--.

Signed and Sealed this

Eighth Day of July, 1997

Attest:

BRUCE LEHMAN

*Attesting Officer*      *Commissioner of Patents and Trademarks*